United States Patent [19]
Toda

[11] Patent Number: 5,251,181
[45] Date of Patent: Oct. 5, 1993

[54] RANDOM ACCESS MEMORY DEVICE AND METHOD OF CONTROLLING SAME IN PIPE LINE PAGE MODE

[75] Inventor: Haruki Toda, Yokohama, Japan

[73] Assignee: Kabushiki Kaisha Toshiba, Kawasaki, Japan

[21] Appl. No.: 892,820

[22] Filed: Jun. 5, 1992

[30] Foreign Application Priority Data

Jun. 5, 1991 [JP] Japan .................................. 3-134086

[51] Int. Cl.⁵ .............................................. G11C 7/00
[52] U.S. Cl. ..................... 365/230.08; 365/189.05; 365/233; 365/238.5
[58] Field of Search ................ 365/189.05, 230.08, 365/233, 238.05

[56] References Cited

U.S. PATENT DOCUMENTS

| | | | |
|---|---|---|---|
| 4,597,061 | 6/1986 | Cline et al. | 365/189 |
| 4,685,088 | 8/1987 | Iannucci | 365/230.08 X |
| 4,849,937 | 7/1989 | Yoshimoto | 365/233 X |
| 4,879,692 | 11/1989 | Tokushige | 365/238.5 X |
| 4,881,200 | 11/1989 | Urai | 365/189.05 X |
| 4,986,666 | 1/1991 | Horra et al. | 365/230.08 |
| 5,023,835 | 6/1991 | Akimoto et al. | 365/230.08 X |
| 5,065,365 | 11/1991 | Hirayama | 365/230.08 X |
| 5,077,693 | 12/1991 | Hardee et al. | 365/233 X |
| 5,083,296 | 1/1992 | Hara et al. | 365/233 X |

FOREIGN PATENT DOCUMENTS

59-171100  9/1984  Japan .

*Primary Examiner*—Eugene R. LaRoche
*Assistant Examiner*—Do Hyun Yoo
*Attorney, Agent, or Firm*—Foley & Lardner

[57] ABSTRACT

A random access memory device is provided with data hold circuits connected midway between a column address write circuit and a column select circuit, between a sense amplifier circuit for amplifying data read from the selected column and a data output circuit, between a write data input circuit and a selected column line, respectively. In data write operation, all the data hold circuits are activated at appropriate timings. In data read operation, all but the data hold circuit connected midway between the column address write circuit and the column select circuit are activatged. In both cases, a data is written to the cell, is outputted in the succeeding cycle after the cycle during which the address data is written. Therefore, data transfer operation is executed in sequence through the routes separated by the data hold circuits, thus enabling the higher speed and more efficient data read and write operation.

6 Claims, 7 Drawing Sheets

RANDOM ACCESS MEMORY DEVICE AND METHOD OF CONTROLLING SAME IN PIPE LINE PAGE MODE

BACKGROUND OF THE INVENTION

1. Field of the Invention

The present invention relates to a random access memory device and a method of controlling the random access memory device in pipe line page mode.

2. Description of the Prior Art

Conventionally, there have been proposed various kinds of high speed operation modes suitable for memory devices provided with a dynamic random access memory (DRAM). The page mode is well known as one of these modes.

Figure 5:
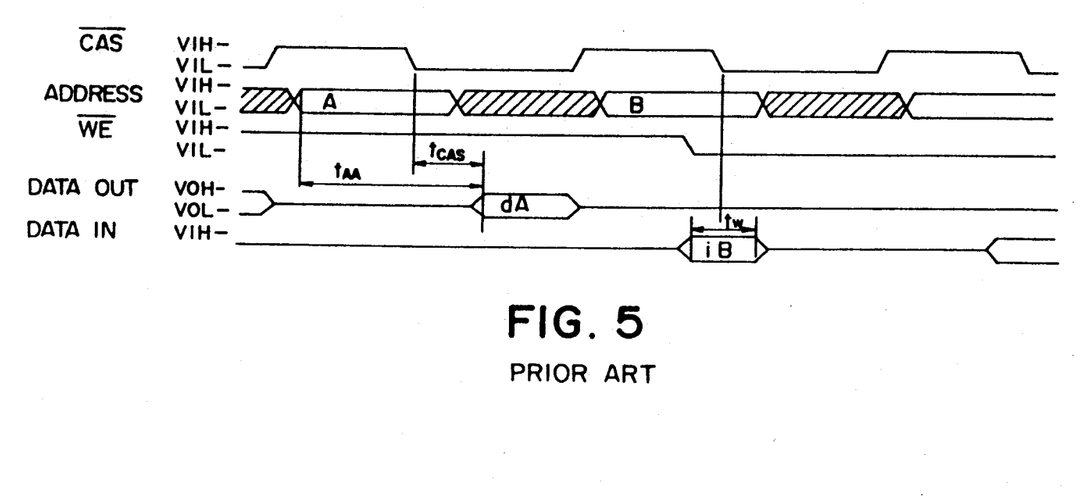
FIG. 5 is a timing chart showing the switching timing between the data read operation and the data write operation in the prior-art high speed page mode.

In this page mode, after one word line corresponding to a row address has first been activated, in order to read a data from the column corresponding to a column address, only the column address is changed to sense data stored at the respective cells connected to the word line, so that the sensed data can be read. In other words, the column addresses are changed by keeping the row address unchanged. FIG. 5 is a timing chart showing the timing of control signals for switching the data read/write operations in this page mode. Further, in the following description, VIH indicates that the input signal level is at "H"; VIL indicates that the input signal level is at "L"; VOH indicates that the output signal level is at "H"; and VOL indicates that the output signal level is at "L", respectively.

FIG. 5 shows a so-called high speed page mode in which a data dA is read from an address A, and an input data iB is written at the address B. Further, in FIG. 5, the time interval between the current rise time and the succeeding rise time of a $\overline{CAS}$ (column address strobe) signal is determined as one cycle. In this one cycle, a series of data are transferred to the cells and written therein, and further, a series of the written data are transferred from the cells to complete the data read operation.

First, in the data read operation, the access operation starts from the address transition after the rise time of the $\overline{CAS}$ signal, and data are outputted during the time interval of tAA or tCAC after the fall time of the $\overline{CAS}$ signal. In the data write operation, input data iB held for a predetermined constant time interval tW at the fall time of the $\overline{CAS}$ signal are internally written to the column selected in the address transition. Here, the data read or write operation is determined by the status of a $\overline{WE}$ (write enable) signal at the fall time of the $\overline{CAS}$ signal. In more detail, the data read operation is determined when the $\overline{WE}$ signal is at a high level, and the data write operation is determined when the WE signal is at a low level. Further, in FIG. 5, the portions of the address signal shown by hatched lines indicate a so-called "don't-care" status in which the address status is not related to the operation.

The control method such that high speed page mode operation is executed at a shorter cycle time interval by continuously executing the high speed page mode as described above over two cycles has been proposed, which is referred to as a pipe line page mode. In this pipe line page mode, there exists such a feature that the operation portions corresponding to the routes for the transfer sequence are separated to execute the data transfer operation.

Figure 6:
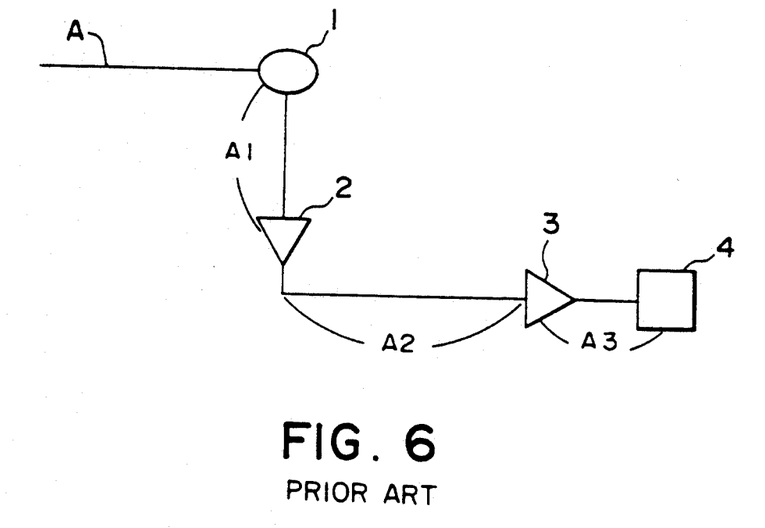
FIG. 6 is a block diagram showing the prior-art data transfer route through which data are read.
Figure 7:
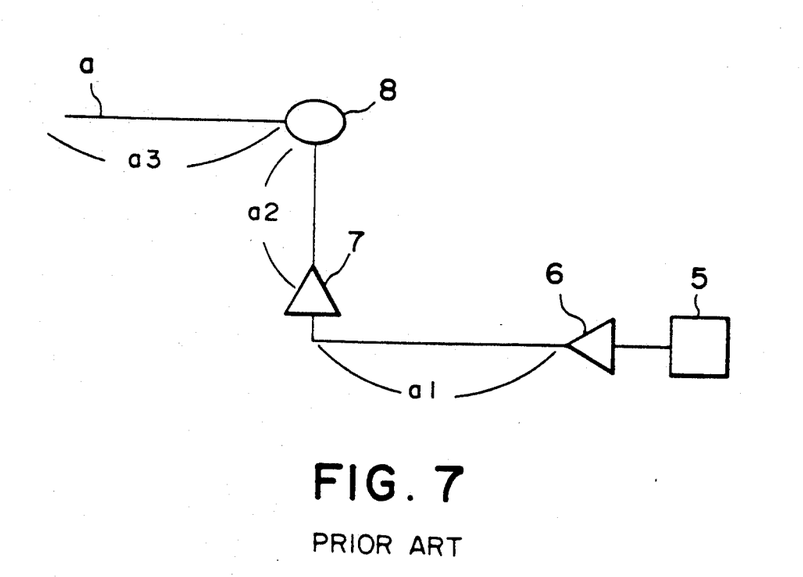
FIG. 7 is a block diagram showing the prior-art data transfer route through which data are written.

The data transfer sequence operation in the pipe line page mode will be described hereinbelow in further detail with reference to FIGS. 6 to 11. FIGS. 6 and 7 typically show the data routes from the bit line to the data input and output, in which FIG. 6 corresponds to data read operation and FIG. 7 corresponds to data write operation, respectively.

In the case of data read operation, a bit line A is connected to a route A1 between a column select gate 1 and an intermediate sense amplifier 2 via the column select gate 1. The column select gate 1 is selected by a column address signal to transfer a data. The intermediate sense amplifier 2 amplifies the transferred data and further transfers the amplified data through a route A2 to an output buffer 3. The output buffer 3 receives the transferred data and outputs the received data to an output terminal 4 through a route A3 in sync with the fall time of the $\overline{CAS}$ signal.

In the case of the data write operation, a data inputted to an input terminal 5 is latched by an input buffer 6 in synchronism with the fall time of the $\overline{CAS}$ signal, and the signal level thereof is converted. The output of the input buffer 6 is transferred to an intermediate buffer 7 through a route a1 for amplification. The amplified data is further transferred to a route a2. Since a column select gate 8 for connecting the route a2 with a bit line a has already been selected by a column address, the data is transferred from the bit line a to the memory cell through the route a3 and then written therein.

Figure 8:
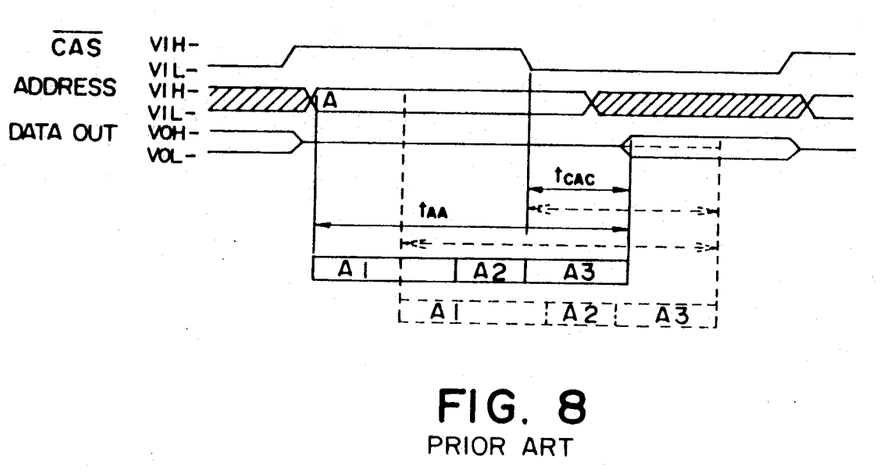
FIG. 8 is a timing chart showing the time allocation of the data transfer route portion in the prior-art high speed page data read mode.
Figure 9:
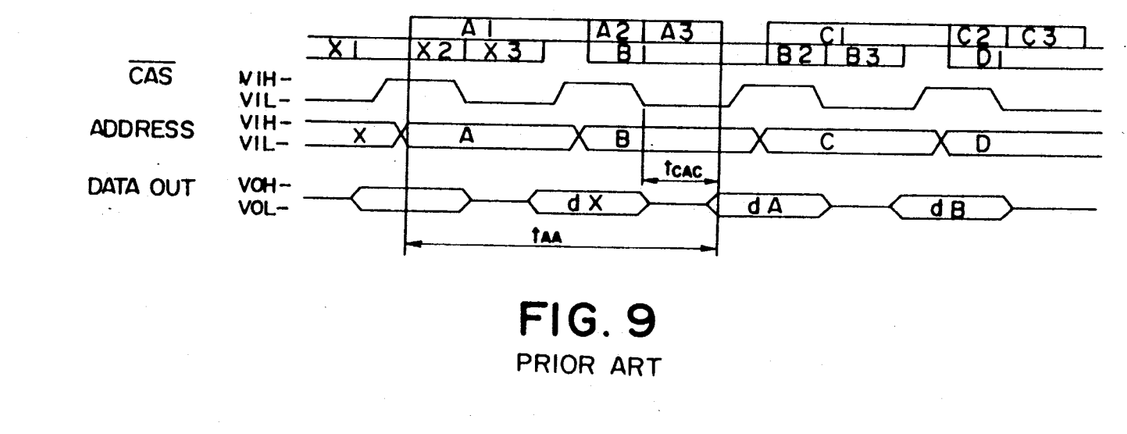
FIG. 9 is a timing chart showing the time allocation of the data transfer route portion in the prior-art pipe line high speed page data read mode.

FIGS. 8 and 9 are examples of the timing charts where the flow time of data is allocated in data read operation in the cycle determined by the $\overline{CAS}$ signal, in which FIG. 8 shows the case of the high speed page mode and FIG. 9 shows the case of the pipe line high speed page mode, respectively.

In FIG. 8, immediately after the address transition status has been detected by an address transition detector (ATD, not shown), the process A1 is activated and further the process A2 is automatically activated. Here, the process A3 is activated at the fall time of the $\overline{CAS}$ signal.

The dot lines shown in FIG. 8 indicate that the address transition is effected again before the fall time of the $\overline{CAS}$ signal. In this case, since the process from A1 is resumed at the address transition start time point and further the $\overline{CAS}$ signal has already fallen before the A2 is activated, the process progresses in sequence in the order of A1, A2 and A3.

FIG. 9 shows the case where a shorter cycle time can be realized by operating the respective processes of A1, A2 and A3, respectively in pipe line fashion. For instance, if the process A1 ends during the process of reading the column address A, this data transfer route portion can be used at the process for reading the succeeding column address B. Therefore, it is possible to effectively use the data transfer system by starting the process of B1 to B3 for the address B immediately after the process A1 ends. However, in the case of the pipe line page mode, the address setting and the $\overline{CAS}$ signal cycle during which the address data is outputted are offset from each other one by one of the $\overline{CAS}$ signal cycle. As described above, in this mode, the access started by the address transition can be defined from the previous cycle (onecycle before the current cycle). Further, as understood by this example, in order to realize the pipe line page mode, it is necessary that the data routes corresponding to the respective process are separated independently.

Figure 10:
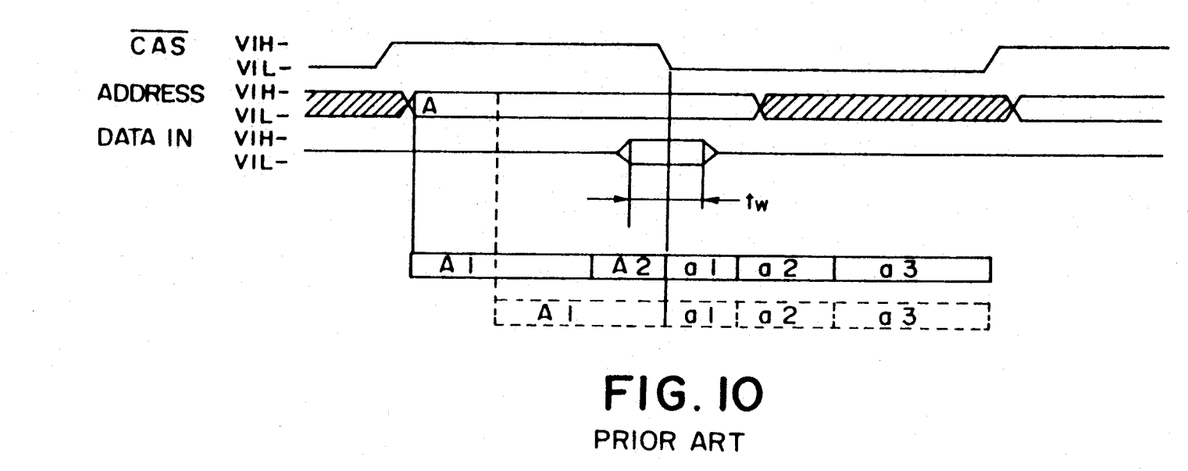
FIG. 10 is a timing chart showing the time allocation of the data transfer route portion in the prior-art high speed page data write mode.
Figure 11:
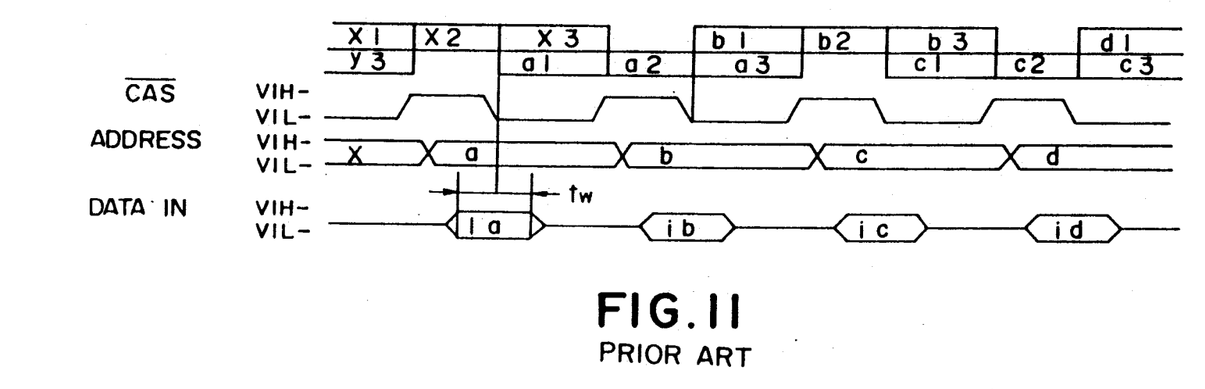
FIG. 11 is a timing chart showing the time allocation of the data transfer route portion in the prior-art pipe line high speed page data write mode.

FIGS. 10 and 11 show the timing charts where the data write time is allocated, in which FIG. 10 indicates the case of the high speed page mode, and FIG. 11 indicates the case of the pipe line high speed page mode.

With reference to FIG. 10, either one of the data read operation and the data write operation is discriminated at the time when the $\overline{CAS}$ signal falls in the $\overline{CAS}$ signal cycle to execute the data write operation. Therefore, here, if the data write operation is first assumed to be executed for instance, the data read operation is started on the basis of the previous address transition. Thereafter, when the data write operation is discriminated at the fall time of the $\overline{CAS}$ signal, the data read operation is stopped at this moment and the data write operation is started. In FIG. 10, the data write operation is executed as a series of operations from al to a3. The dot lines indicate that the address transition is delayed, which teaches that although the data write operation starts before the data read operation does not sufficiently progress, it is well understood that the sequence al, a2 and a3 of the data write operation started at the fall time of the $\overline{CAS}$ signal will not change.

With reference to FIG. 11, since data is decided at the data transfer route portion of the sequence a2 at the time when the operation of the sequence a3 starts, it is possible to utilize the data transfer route portion of the sequence al for the data write operation of another column address, after the data has been transferred from al to a2. Therefore, by executing pipe line operation, the data write operation can be executed during a shorter cycle. In other words, the sequence a3 is activated in the succeeding $\overline{CAS}$ signal cycle after the $\overline{CAS}$ signal cycle during which a data is written, in parallel to the data write operation to the bit line of the address b.

In the prior-art pipe line high speed page mode, however, since there exists no idle time usable for another operation in the data transfer route, it is impossible to mix the data write operation with the data read operation. Therefore, as is the case of the page mode shown in FIG. 10, it is impossible to set a certain $\overline{CAS}$ signal cycle to any one of the data read operation and the data write operation at the head of the cycle thereof. In the data write operation in this pipe line page mode, although there exists no problem in that the $\overline{CAS}$ signal cycles of the address and the data are offset from each other as is the case of data read operation, since the data is written in the cell at the succeeding cycle, the $\overline{CAS}$ signals of two cycles are inevitably required.

As described above, in the prior-art pipe line high speed page mode, since the data transfer routes are superimposed upon each other at the respective cycles and therefore the cycle during which an address is written is different from the cycle during which a data is read between the data read and write operations, it has been difficult to mix the data read and write operations during the same page mode cycle.

Furthermore, the pipe line control is disclosed in U.S. Pat. No. 4,597,061 (Jun. 24, 1986). In this Patent document, however, the concept is such that the latching and then outputting a data or an address is applied to a SRAM, and nothing is disclosed of how to execute the pipe line page mode control by use of the DRAM, in practice.

SUMMARY OF THE INVENTION

With these problems in mind, therefore, it is the object of the present invention to provide a random access memory device and a method of controlling the same device in pipe line page mode, by which the data read operation and the data write operation can be executed at high speed and at high efficiency and additionally, can be smoothly switched.

According to one aspect of the present invention, there is provided a random access memory device, comprising: a random access memory array having dynamic memory cells arranged in matrix form; a column address buffer circuit for writing a column address of the random access memory array from the outside in a first cycle, and for converting a level of a column address signal; an address data hold circuit for holding an address data level-converted by the column address buffer circuit till a second cycle succeeding to the first cycle; a column decoder for forming a column select signal on the basis of the address data held by the address data holding circuit in the second cycle; a data input buffer circuit for writing a write data to be written to the cell in data write operation from the outside in the first cycle, and for converting level of the signal; a write data hold circuit provided midway in a data transfer route to a column selected in accordance with the column address, for holding the write data till the second cycle; a sense amplifier circuit for sensing and amplifying a data read from a column selected in accordance with the column address written in the first cycle in the data read operation; a read data hold circuit for holding the read data amplified by the sense amplifier circuit till a start time of the second cycle; and a data output buffer for outputting an output of the read data hold circuit to the outside.

According to another aspect of the present invention, there is provided a method of controlling the random access memory device in pipe line page mode, comprising the steps of: in the data write operation, holding an address data written in the first cycle by the address data hold circuit, selecting a write address column in the succeeding second cycle; and writing a data to be written to the data input buffer from the outside in the first cycle, holding the written data by the write data hold circuit, and transferring the held data to the selected column in the second cycle; and in the data read operation, immediately selecting an address column in the first cycle to read a cell data, without holding the address data written in the first cycle by the address data hold circuit, holding the read data by the data hold circuit; and outputting the held data from the data output buffer to the outside in the second cycle.

In the random access memory device and the control method thereof according to the present invention, a data holding circuit is additionally provided midway between a column address read circuit and a column address select circuit, midway between a sense amplifier for amplifying data read from the selected column and a data outputting circuit, and between an input circuit for inputting data to be written and a selected column line, respectively. In the data write operation, all the data holding circuits are activated at appropriate timings. In the data read operation, all but the data holding circuit provided between the column address read circuit and the column select circuit are activated. In both cases, a data is written to the cell; or is outputted from the device, all during the succeeding cycle after the cycle in which an address data is written. Therefore, it is possible to execute the data transfer operation in sequence according to the routes separated by the data holding circuits, thus enabling high speed and high efficient data read and write operation.

DETAILED DESCRIPTION OF THE PREFERRED EMBODIMENTS

With reference to the attached drawings, an embodiment of the pipe line page mode dynamic random access memory system according to the present invention will be described herein below.

Figure 1:
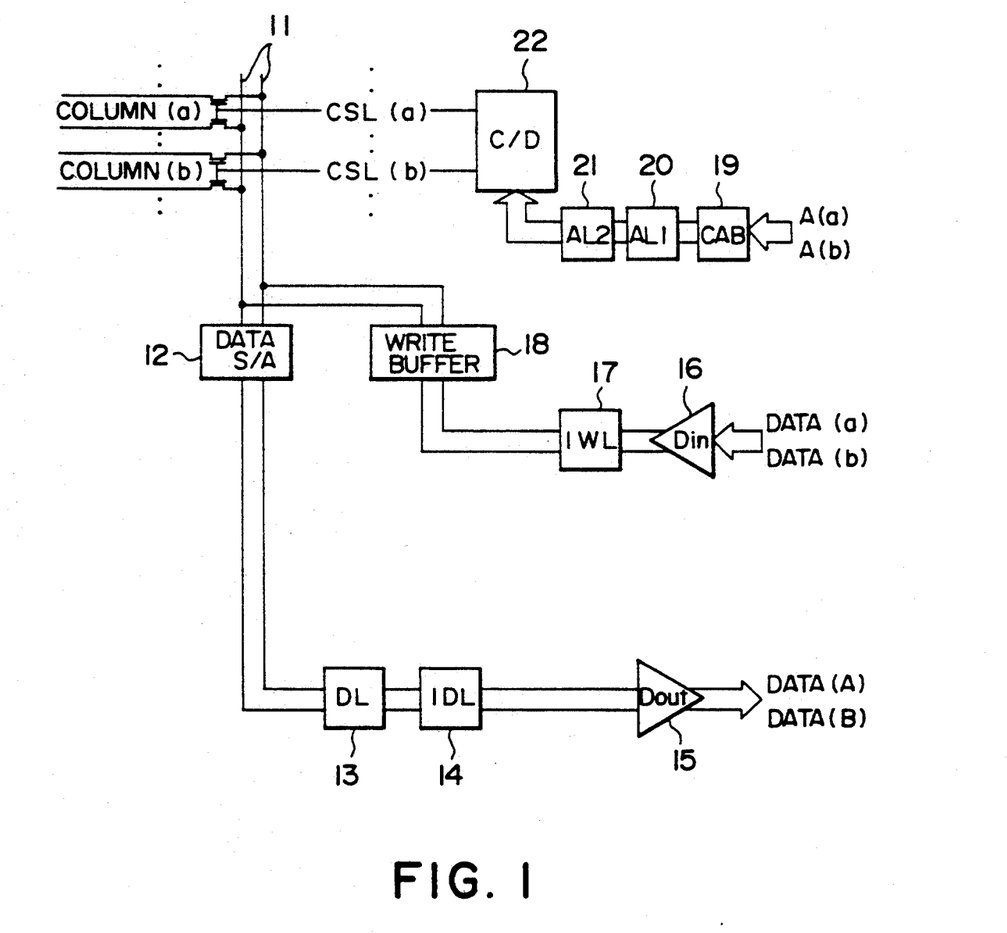
FIG. 1 is a block diagram showing the practical system configuration for executing the pipe line high speed page mode according to the present invention.

FIG. 1 is a block diagram showing the practical configuration of the data transfer routes.

A plurality of column lines corresponding to a plurality of memory cell columns (a), (b), ... of a memory cell array (not shown) arranged in a matrix form are connected to data lines 11. Transfer gates turned on in response to column select signals CSL are provided for the respective column lines. When either one of the transfer gates is turned on in response to the CSL signal outputted from a column decoder (C/D) 22 according to an address, the data line 11 and a column along which a data is transferred are selected. The column address is written in a column address buffer (CAB) 19, and then supplied to the column address decoder 22 via two address buffers (AL1) 20 and (AL2) 21. These address buffers hold the written address data till the succeeding cycle for executing the pipe line operation, after having written the address data. To the data line 11, a data sense amplifier 12, a data latch (DL) 13, an intermediate data latch (IDL) 14, and a data output buffer 15 are connected as a data read route. Further a write buffer 18, an intermediate write latch (IWL) 17, and a data input (Din) buffer 16 are connected as a data write route.

In the data read operation, the data amplifier 12 is driven to amplify and latch the read data. The read data is transferred and outputted to the data output (Dout) buffer 15 through two latches of the data latch (DL) 13 and the intermediate latch (IWL) 14.

On the other hand, in the data write operation, a data written by the data input buffer 16 is transferred to the write buffer 18 through the intermediate latch (IDL) 17 to activate this write buffer 18.

The pipe line high speed page mode operation executed by controlling the data transfer circuit constructed as described above will be described hereinbelow in details.

Figure 2:
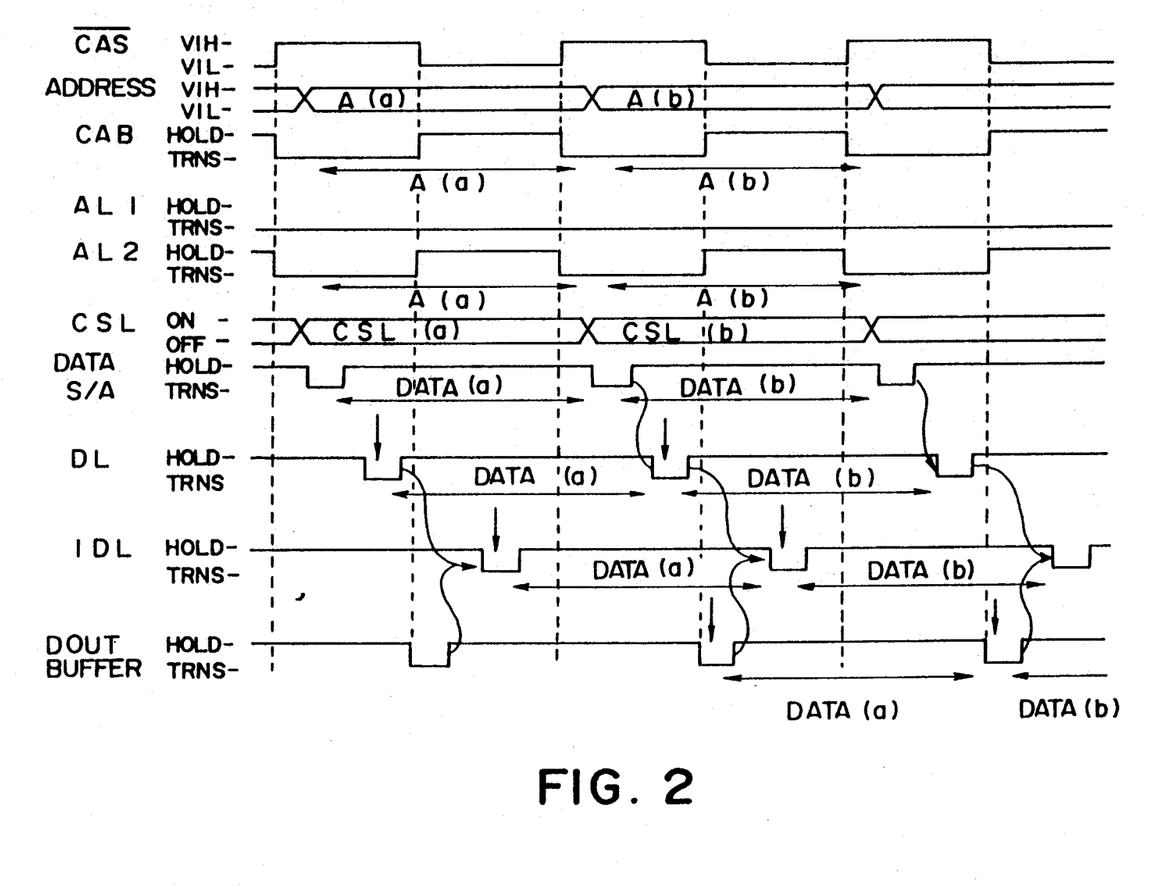
FIG. 2 is a timing chart showing the control timing of the data read operation by the system shown in FIG. 1.

FIG. 2 is a timing chart for assistance in describing the control method in the data read operation, which shows a data transfer sequence. In the following description, HOLD indicates a status where the data is latched, and TRNS indicates a status where a data is received and therefore the content of a previous data is changed to the data transferred from the preceding stage.

With respect to the address, the address latch 20 is always in the TRNS status without executing any latch operation, so that the data is passed therethrough as it is. Further, the column address buffer 19 and the address latch 21 are so activated as to latch the address when the $\overline{CAS}$ signal is at VIL. Therefore, as shown in FIG. 2, the addresses A (a) and A (b) are transferred to the column decoder 22 being latched by the address latch 21, so that a column is selected by the column decoder 22 as shown in FIG. 2.

FIG. 2 shows the status in which the CSL (b) is turned on after the CSL (a) has been turned on. As shown, since the column select signal CSL is turned on from the address transition start time point, data can be read from the selected column and simultaneously the data sense amplifier 12 changes to the TRNS status and further to the HOLD status after the data is decided perfectly to latch the decided data. Then, the data latch 13 changes to the TRNS status to receive the data from the data sense amplifier, and further latches the data after the data is decided perfectly. Under these conditions, if the $\overline{CAS}$ signal falls, the data output buffer 15 changes to the TRNS status to receive and output the data latched by the intermediated data latch 14. The data latched by this intermediate latch 14 is the data decided by the address transition during the previous cycle.

After a short time, the data output buffer 15 changes to the HOLD status to fix the output status. Therefore, as far as the data latch 13 and the data output buffer 15 are both in the HOLD status, the latched data (a) is received by the intermediate data latch 14 of the TRNS status and then latched, after the data has been decided, till the fall time of the succeeding $\overline{CAS}$ signal. Further, it is necessary that the data latch 14 be kept at the HOLD status to change the intermediate data latch 14 to the TRNS status, thus securing stable data transfer when the cycle is short. Accordingly, the intermediate data latch 14 executes the data transfer from the address transition to the data latch and additionally the data output relay beginning from the fall time of the $\overline{CAS}$ signal, so that it is possible to output the data during two cycles of the $\overline{CAS}$ signal without any inconsistency.

In the system configuration shown in FIG. 1, the data read route A1 shown in FIG. 6 corresponds to the route until data is latched by the intermediated data latch 14, the route A2 corresponds the route from the intermediate data latch 14 to the data buffer 15, and the route A3 corresponds to the route from the data buffer 15 to the output.

Figure 3:
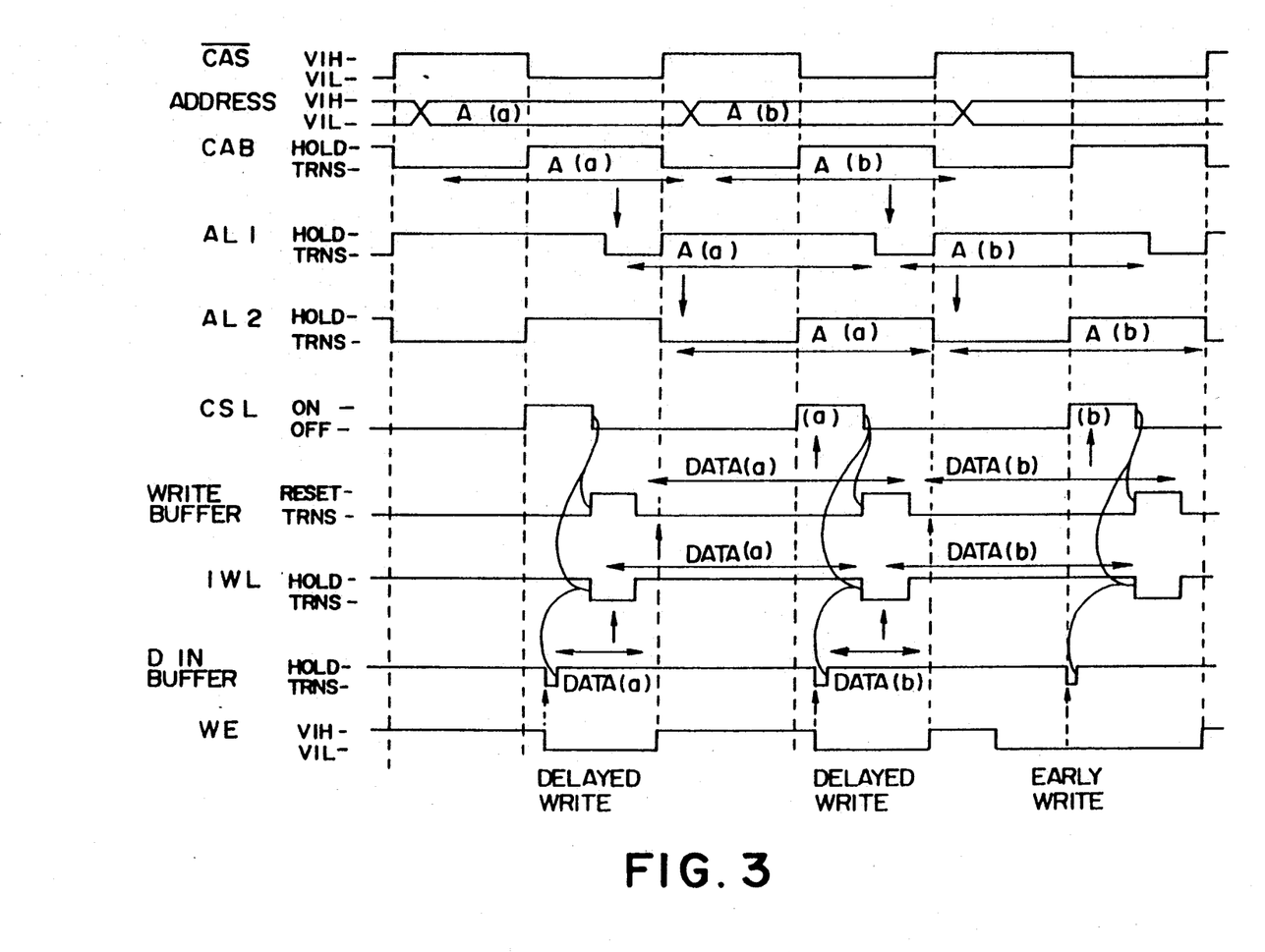
FIG. 3 is a timing chart showing the control timing of the data write operation by the system shown in FIG. 1.

FIG. 3 is a timing chart for explaining the data write operation.

In the data write operation, since the cycle in which a data is written is different by one cycle from the cycle in which the written data is actually written in the cell, certain measures different from the data read operation are required for the address processing. In this example, the data write operation is the same as the data read operation with respect to the column address buffer 19 and the address latch 21, in comparison with the case shown in FIG. 2. However, the operation of the address latch 20 is different between the data read operation and the data write operation.

The address latch 20 changes to the TRNS status, slightly after the $\overline{CAS}$ signal falls and therefore the address is latched by the column address buffer, so that the address data of the column address buffer is written. At the rise time of the $\overline{CAS}$ signal, the address latch 20 changes to the HOLD status to latch the address data, and then the latched address data is transferred to the address latch 21 whose status changes to the TRNS status. Then, if the $\overline{CAS}$ signal falls, one of the column select signals CSL is selectively outputted from the column decoder 22 in accordance with the address data latched in the address latch 21, so that a data is written through the data line 11 connected to the selected column.

On the other hand, with respect to data, the data is written from the outside to the data input buffer 16 at either later fall time of the $\overline{CAS}$ signal or $\overline{WE}$ signal during the same cycle as the address data write cycle. When the fall time of the $\overline{WE}$ signal is later and therefore the input data is written at the fall time of this signal, this operation is referred to as delay write. When the fall time of the $\overline{CAS}$ signal is later and therefore the input data is written at the fall time of this signal, this operation is referred to as early write. After having written the data, the data input buffer 16 latches the written data, that is, holds the written data until the succeeding data is written.

Where the column select signal CSL during the data write cycle changes to the off status and additionally the data input buffer changes to the data HOLD status, since this indicates that a new data is held, the intermediate write latch 17 changes to the TRNS status to write the data in the data input buffer 16, and thereafter changes to the HOLD status. Further, when the column select signal CSL is turned off, the write buffer 18 is reset to once delete the data on the data line 11. However, when the data is decided by the intermediate write latch 17, the write buffer 18 changes to the TRNS status again to start the operation of writing a data to the data line 11. The data written in the data line 11 is written to the column on the basis of the column select signal CSL turned on at the head of the succeeding $\overline{CAS}$ signal cycle, to rewrite the cell data.

As described above, the intermediate write latch 17 relays the data transfer, in the data write operation to the column decided on the basis of the $\overline{CAS}$ signal of the succeeding cycle, in cooperation with the data input buffer 16 controlled at the timing of the external signal $\overline{WE}$ determined independently from the $\overline{CAS}$ signal.

In the above system configuration, the route a1 shown in FIG. 7 corresponds to that between the data input buffer 16 and the intermediate write latch 17; the route a2 corresponds to that from the intermediate write latch 17, through the write buffer 18, to the column select line CSL; and the route a3 corresponds to the data route for the column, respectively.

Figure 4:
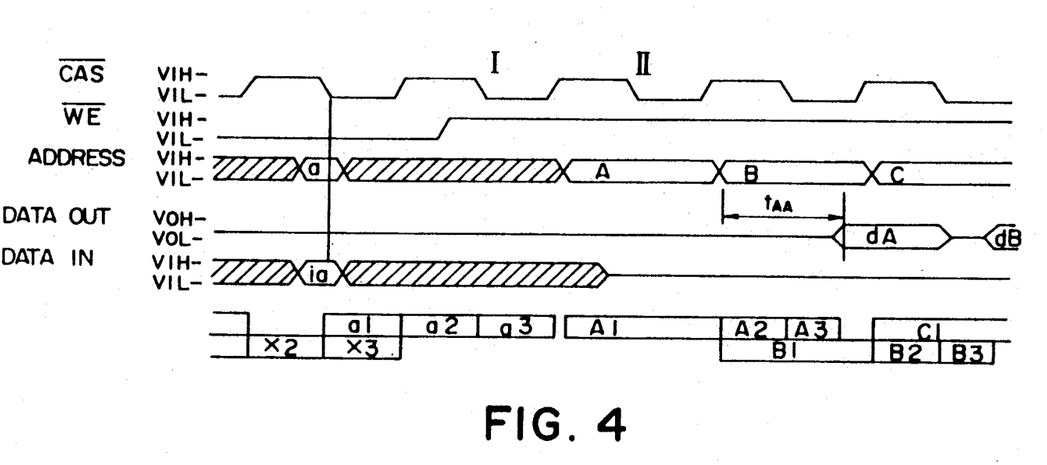
FIG. 4 is a timing chart for showing the switching timing between the data write operation and the data read operation in the pipe line high speed page mode.

With reference to FIG. 4, the control signal conditions for when the pipe line mode is switched from the data write mode to the data read mode will be described hereinbelow.

FIG. 4 shows the case where the data write operation is switched to the data read operation after an address a has been written.

During the cycle of address a, since the $\overline{WE}$ signal is at "L" level due to the fall of the $\overline{CAS}$ signal, a data is immediately written, and then written to the column a during the succeeding $\overline{CAS}$ signal cycle I. As with the case of the cycle I, if the $\overline{WE}$ signal is kept at "H" level over the period during which the $\overline{CAS}$ signal is at "L", the internal operation is switched to the data read operation at the rise time of the $\overline{CAS}$ signal, and the data access operation starts for the address during the period when the $\overline{CAS}$ signal is at "H". In the cycle II, a data of the address A is transferred internally, and this data is outputted on the basis of the $\overline{CAS}$ signal in the succeeding cycle. As described above, when the data write operation is switched to the data read operation, it is possible to smoothly execute the switching operation by additionally providing one cycle I as shown in FIG. 4 (referred to as a dummy cycle) during which the address and data inputs are both allowed to be ineffective.

In the above-mentioned embodiment, two-stage address latch circuit has been adopted to hold the input address. Without being limited thereto, however, it is also possible to consider the first stage address latch as a part of the function of the column address buffer.

Further, it is possible to determine the holding time periods of the intermediate latches provided at the data input route and the data output route to any given values, as far as the time periods extend to the succeeding cycle.

As described above, in the random access memory device according to the present invention, the data hold circuit is provided at the column address input route, the write data input route, and the data output route, respectively; and further these data hold circuits are activated at appropriate timings according to the data read and write operations. Therefore, it is possible to execute the data transfer operation smoothly in sequence through the routes separated by the data hold circuits, thus realizing the higher speed and more efficient data transfer operation.

What is claimed is:

1. A random access memory device, comprising:
    a random access memory array having dynamic memory cells arranged in matrix form;
    a column address buffer circuit for writing a column address of said random access memory array from the outside in a first cycle, and for converting a level of a column address signal;
    an address data hold circuit for holding an address data level converted by said column address buffer circuit till a second cycle succeeding to the first cycle;
    a column decoder for forming a column select signal on the basis of the address data held by said address data holding circuit in the second cycle;
    a data input buffer circuit for writing a write data to be written to the cell in data write operation from the outside in the first cycle, and for converting level of the signal;
    a write data hold circuit provided midway in a data transfer route to a column selected in accordance with the column address, for holding the write data till the second cycle;

a sense amplifier circuit for sensing and amplifying a data read from a column selected in accordance with the column address written in the first cycle in a data read operation;

a read data hold circuit for holding the read data amplified by said sense amplifier circuit till a start time of the second cycle; and a data output buffer for outputting an output of said read data hold circuit to the outside.

2. The random access memory device of claim 1, wherein said address data hold circuit is a two-stage latch circuit.

3. The random access memory device of claim 1, wherein said write data hold circuit is composed of an intermediate write latch circuit and a write buffer.

4. The random access memory device of claim 1, wherein said read data hold circuit is composed of a data latch circuit and an intermediate data latch circuit.

5. A method of controlling the random access memory device of claim 1 in pipe line page mode, comprising the steps of:

in the data write operation, holding an address data written in the first cycle by said address data hold circuit, selecting a write address column in the succeeding second cycle; and writing a data to be written to said data input buffer from the outside in the first cycle, holding the written data by said write data hold circuit, and transferring the held data to the selected column in the second cycle; and in the data read operation, immediately selecting an address column in the first cycle to read a cell data, without holding the address data written in the first cycle by said address data hold circuit, holding the read data by said data hold circuit; and outputting the held data from said data output buffer to the outside in the second cycle.

6. The method of controlling the random access memory device in pipe line page mode of claim 5, comprising the steps of: when a command of switching the data write operation to the data read operation is given during a cycle, determining the current cycle as a dummy cycle such that the data output from the column selected on the basis of a given address data and additionally the data write operation of the write data given in the current cycle are both disabled, starting the data read operation in the succeeding cycle, and outputting the data read in the succeeding read cycle in the further succeeding cycle.

* * * * *